US010732239B2

(12) United States Patent
Wikus et al.

(10) Patent No.: US 10,732,239 B2
(45) Date of Patent: Aug. 4, 2020

(54) CRYOGEN-FREE MAGNET SYSTEM COMPRISING A MAGNETOCALORIC HEAT SINK

(71) Applicant: Bruker Switzerland AG, Faellanden (CH)

(72) Inventors: Patrick Wikus, Nuerensdorf (CH); Joerg Hinderer, Waldshut-Tiengen (DE)

(73) Assignee: BRUKER SWITZERLAND AG, Faellanden (CH)

(*) Notice: Subject to any disclaimer, the term of this patent is extended or adjusted under 35 U.S.C. 154(b) by 409 days.

(21) Appl. No.: 15/592,889

(22) Filed: May 11, 2017

(65) Prior Publication Data

US 2017/0328968 A1    Nov. 16, 2017

(30) Foreign Application Priority Data

May 12, 2016   (DE) .................. 10 2016 208 226

(51) Int. Cl.
*G01R 33/38* (2006.01)
*H01F 6/04* (2006.01)
(Continued)

(52) U.S. Cl.
CPC .......... *G01R 33/3804* (2013.01); *F17C 3/085* (2013.01); *F25B 9/14* (2013.01);
(Continued)

(58) Field of Classification Search
CPC ... G01R 33/3804; G01R 33/3815; F25B 9/14; F25B 21/00; F25B 2321/002;
(Continued)

(56) References Cited

U.S. PATENT DOCUMENTS 4,726,199 A * 2/1988 Takano ................. F25B 23/006
                                                            165/104.21
4,827,217 A * 5/1989 Paulson ............. A61B 5/04005
                                                               324/201
(Continued)

FOREIGN PATENT DOCUMENTS

DE         19914778 B4    10/1999
DE    102006006326 A1    10/2007
(Continued)

OTHER PUBLICATIONS

Zhu et al., "Magnetocaloric effect of (ErxR1-x)Co2(R=Ho,Dy) for magnetic refrigeration between 20 and 80 K", Cryogenics 51, 2011, pp. 494-498.
(Continued)

*Primary Examiner* — Keith M Raymond
(74) *Attorney, Agent, or Firm* — Edell, Shapiro & Finnan, LLC

(57) ABSTRACT

A cryostat system is kept at a cryogenic operating temperature without providing or supplying cryogenic fluids by a cryocooler. The cryostat system includes a superconducting magnet arrangement and a heat sink apparatus to prolong the time before the superconducting magnet arrangement quenches/returns to the normally conducting state if active cooling fails. The heat sink apparatus includes magnetocaloric material and is thermally connected to the superconducting magnet arrangement and/or to parts of the cryostat system through which ambient heat can flow to the superconducting magnet arrangement. In this way, the cryostat system can be operated in a truly "cryogen-free" manner while maintaining a sufficiently long time to quench in the event of potential operational malfunctions.

18 Claims, 3 Drawing Sheets

(51) Int. Cl.
*F25D 19/00* (2006.01)
*F25B 21/00* (2006.01)
*F25B 9/14* (2006.01)
*F17C 3/08* (2006.01)
*G01R 33/3815* (2006.01)

(52) U.S. Cl.
CPC ............ F25B 21/00 (2013.01); F25D 19/006 (2013.01); G01R 33/3815 (2013.01); H01F 6/04 (2013.01); *F17C 2270/0527* (2013.01); *F17C 2270/0536* (2013.01); *F25B 2321/002* (2013.01); *Y02B 30/66* (2013.01)

(58) Field of Classification Search
CPC ........ F25D 19/006; F25D 19/00; F25D 23/06; H01F 6/04; H01F 6/006; H01F 6/06; H01F 6/02; F17C 3/085; F17C 3/08; F17C 2270/0527; F17C 2270/0536; Y02B 30/66

See application file for complete search history.

(56) References Cited

U.S. PATENT DOCUMENTS

| | | | | |
|---|---|---|---|---|
| 5,408,178 A | * | 4/1995 | Wikswo, Jr. | ............ G01R 33/10 324/201 |
| 5,737,927 A | * | 4/1998 | Takahashi | ............. F25D 19/006 62/383 |
| 5,887,449 A | * | 3/1999 | Pecharsky | ............... F25B 21/00 62/3.1 |
| 6,107,905 A | | 8/2000 | Itoh et al. | |
| 7,898,778 B2 | * | 3/2011 | Kurusu | ..................... H01F 6/02 361/19 |
| 8,037,692 B2 | * | 10/2011 | Muller | .................... F25B 21/00 62/3.1 |
| 9,568,569 B2 | * | 2/2017 | Mikami | ..................... H01F 6/02 |
| 2007/0186560 A1 | | 8/2007 | Schauwecker et al. | |
| 2013/0008187 A1 | * | 1/2013 | Kraus | ....................... F17C 3/08 62/51.1 |
| 2016/0084440 A1 | | 3/2016 | Strobel | |
| 2018/0081011 A1 | * | 3/2018 | Wikus | ................ G01R 33/3804 |

FOREIGN PATENT DOCUMENTS

| | | |
|---|---|---|
| DE | 102014218773 A1 | 3/2016 |
| EP | 0937953 A1 | 8/1999 |
| JP | 2002106999 A | 4/2002 |

OTHER PUBLICATIONS

Wikus et al., "Magnetocaloric materials and the optimization of cooling power density", Cryogenics 62, 2014, pp. 150-162.

* cited by examiner

PRIOR ART

The specific heat of $(Er_{0.53}Ho_{0.47})Co_2$

CRYOGEN-FREE MAGNET SYSTEM COMPRISING A MAGNETOCALORIC HEAT SINK

CROSS REFERENCE TO RELATED APPLICATIONS

This application claims foreign priority under 35 U.S.C. § 119(a)-(d) to German Application No. 10 2016 208 226.4 filed on May 12, 2016, the entire contents of which are hereby incorporated into the present application by reference.

FIELD OF THE INVENTION

The present invention relates to a cryogenic system for cooling a superconducting magnet coil system as used, for example, in applications in magnetic resonance spectroscopy (NMR) or magnetic resonance imaging (MRI).

BACKGROUND

The invention relates in particular to a cryostat system that can be kept at a cryogenic operating temperature in a dry manner, i.e. without providing or supplying cryogenic fluids, with a cryocooler. In addition to the cryocooler, the cryostat system includes a superconducting magnet arrangement and a heat sink apparatus. The heat sink apparatus prolongs the time before the superconducting magnet arrangement returns to the normally conducting state (i.e., "time to quench") if the active cooling of the cryocooler fails. A similar cryostat system of this kind, which does however still contain small amounts of a liquid cryogen, is known, e.g. from EP 0 937 953 A1 or DE 199 14 778 B4.

Superconducting magnets are cooled to cryogenic temperatures in order to function. Many users prefer "cryogen-free" magnets for this purpose, which forgo the use of cryogens (e.g. liquid helium and/or liquid nitrogen) entirely and maintain the operating temperature exclusively through use of "cryocoolers", i.e. in a "dry" manner. Pulse tube, Stirling or Gifford-McMahon coolers are typically used in this context.

A cryogen-free magnet system of this kind typically has a very short time to quench the superconducting magnet system. If the cryocooler malfunctions (e.g., as a result of a power outage, an interruption to the cooling water supply, or a mechanical defect in the compressor or cold head), the superconducting magnet system very quickly heats up beyond the allowable operating temperature and quenches. The magnet system then cannot be used for a long time, since it must be cooled back down and recharged.

One possibility for increasing the time to quench consists in providing small amounts of a cryogen to evaporate when the active cooling of the cryocooler fails. The evaporation heat of the cryogen keeps the temperature of the magnet constant in the event of a cooler malfunction. This technology is commonly referred to as "Minimum Condensed Volume." This technology is disadvantageous in that, strictly speaking, even the use of small amounts of a cryogen is not compatible with the definition of "cryogen-free". Moreover, a system must be provided in order to condense the cryogen during the cooling of the magnet. Another disadvantage is the limited number of practical cryogens that can be used, resulting in only a few operating temperature ranges (e.g. approximately 2.5K-4.5K for He, approximately 70K-77K for LN2, etc.).

In the European patent reference EP 0 937 953 A1, the time to quench is prolonged by storing small amounts of a cryogen in a reservoir provided for this purpose. The coil itself is located within this reservoir. Although said reservoir is designed so as to be significantly smaller than a "conventional" helium tank in order to keep the amount of cryogen as small as possible, this arrangement is not truly "dry" in the strict sense of the term.

In the cryostat arrangement according to German patent reference DE 199 14 778 B4, the time to quench is also prolonged by storing small amounts of a cryogen in a reservoir provided for this purpose. However, the coil itself is located in the vacuum and is thermally connected to the reservoir.

In the cryostat system described in the German patent reference DE 10 2014 218 773 A1, the objective is also that of prolonging the time to quench. However, a completely different approach is taken to prolong the time to quench. In this reference, the thermal coupling between the coil and the cooler is reduced if the active cooler fails, minimizing the heat path to the superconducting magnet through the failed cooler.

SUMMARY

Embodiments of the present invention improve a "dry" cryostat system comprising a superconducting magnet coil system using a particularly simple technical approach so as to avoid the aforementioned drawbacks of the known prior art arrangements. In particular, it is intended to operate the cryostat arrangement in a truly cryogen-free manner and to permit a sufficiently long time to quench in the event of potential operational malfunctions.

To prolong the time to quench in a cryogen-free cryostat system, the heat sink apparatus includes magnetocaloric material. The heat sink apparatus is thermally connected to the superconducting magnet arrangement and/or to parts of the cryostat arrangement, through which ambient heat can flow to the magnet arrangement.

The cryostat system permits a superconducting magnet arrangement to actually be operated in a "dry" manner, i.e. to keep the cryostat system at a cryogenic operating temperature without supplying cryogenic fluids, and prolongs the time to quench the superconducting magnet system, maintaining this operating temperature for a significant period of time, even in the event that active cooling fails.

To effectively prolong the time to quench, the heat sink apparatus utilizes the magnetocaloric effect, by which magnetocaloric material draws heat from its surroundings when it is demagnetized, while remaining at a nearly constant temperature. The present invention also encompasses variants in which the material is not demagnetized. Instead a magnetic field is created in the material in order to maximize the specific heat.

BRIEF DESCRIPTION OF THE DRAWINGS

The invention is illustrated in the drawings and is explained in greater detail with reference to the embodiments.

DETAILED DESCRIPTION

The magnetocaloric effect describes the thermal reaction of a system to a change in the magnetic field. Magnetocaloric materials, such as paramagnetic salts, some oxides and fluorides of rare earths or "Laves phase" materials, are employed, inter alia, in magnetic coolers (for example, in adiabatic demagnetization cryostats). These magnetocaloric materials are characterized in that their entropy can be modified by applying a magnetic field.

Figure 3A:
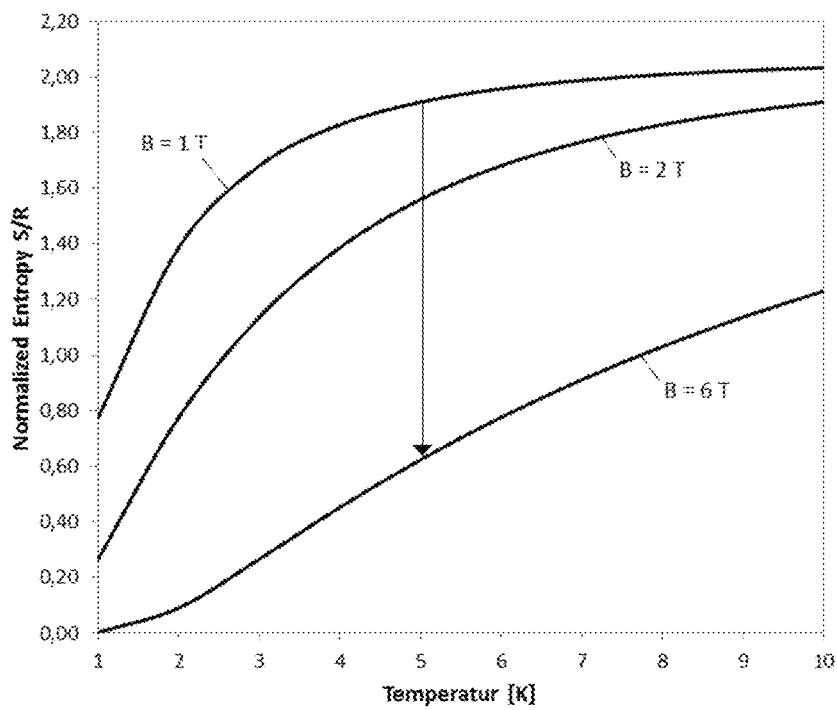
FIG. 3A is an entropy-temperature diagram for the magnetocaloric material GGG (gadolinium gallium garnet) for three different magnetic fields (B=1 T, 2 T and 6 T), the entropy S being normalized to the ideal gas constant R

As an example, FIG. 3A shows an entropy-temperature diagram for the magnetocaloric material GGG (gadolinium gallium garnet) for three different magnetic fields (B=1 T, 2 T and 6 T). The entropy S is normalized to the ideal gas constant R. At a temperature of 5K, the normalized entropy S/R can thus be lowered to a value of approximately 0.62 by applying a magnetic field of 6 T. This is indicated by the arrow in the figure.

If an entropy change ΔS occurs at temperature T in an isothermal process, a heat quantity Q is either released or adsorbed:

$$Q = T \cdot \Delta S$$

When the entropy is lowered (e.g., during the magnetization of the magnetocaloric material), heat is released. Conversely, heat is adsorbed during demagnetization of the magnetocaloric material. This property can be utilized to increase the time to quench in a cryogen-free magnet system comprising a superconducting main coil. To do so, magnetocaloric material can be placed within a superconducting auxiliary coil, for example.

When the system cools down, this auxiliary coil is charged (i.e., a magnetic field is established in the magnetocaloric material) and the entropy of the magnetocaloric material declines. The heat that is released as the entropy declines is withdrawn by a cryocooler. The auxiliary coil may then be superconductively short-circuited to set up a persistent magnetic field.

If the cryocooler malfunctions, the superconducting auxiliary coil is slowly discharged. The magnetocaloric material absorbs heat in the process. The discharge speed can be selected such that the rate at which heat is absorbed in the magnetocaloric material corresponds to the rate at which heat flows into the system (e.g., via the mechanical support structure or current supply lines, or via radiation, as well as via the malfunctioning cryocooler. Balancing the heat absorbed in the magnetocaloric material with the heat flowing into the system maintains the temperature of the main superconducting coil.

Gadolinium gallium garnet (GGG) has an ion concentration of $1.26 \times 10^{22}$ cm$^{-3}$. For a volume of one liter and at the ideal gas constant R=8.314 J/(mol·K) at a temperature of 5K, an entropy of 332 J/K will result at 1 T, and an entropy of 109 J/K will result at 6 T. Therefore, at a temperature of 5K, 1115 J can be absorbed during demagnetization from 6 T to 1 T. At a heat load of 100 mW=0.1 W, the time to quench is prolonged by 11,150 seconds or by somewhat more than three hours.

A volume of one liter (e.g., a cylinder 10 cm in length and approximately 12 cm in diameter) can easily be accommodated in typical cryostat systems. Upon evaporating, one liter of liquid helium would withdraw a heat quantity of approximately 2625 J at a temperature of 4.2K. Evaporating liquid helium thus has greater volumetric efficiency, especially since the volume of the auxiliary coil must still be taken into account in the magnetocaloric heat sink.

Since many devices that are required for the operation of a superconducting magnet coil are generally already present in a cryogen-free magnet (e.g., insulation vacuum, power supplies, etc.), it is relatively simple to integrate an additional coil of this kind.

Figure 3B:
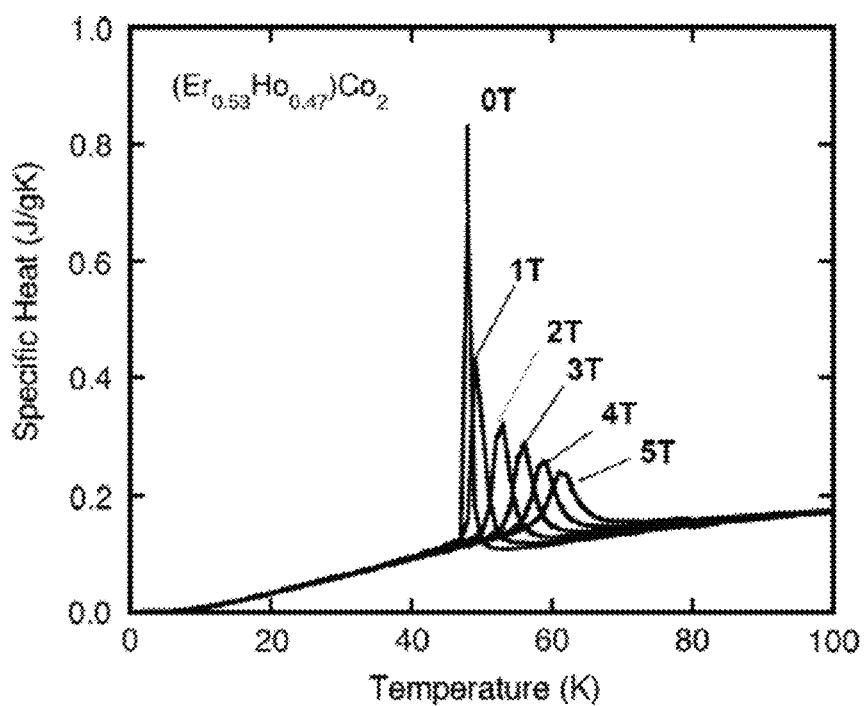
FIG. 3B shows the specific heat of magnetocaloric material $(Er_{0.53}Ho_{0.47})Co_2$ as a function of temperature.

Possible magnetocaloric materials include GGG (gadolinium gallium garnet), dysprosium gallium garnet (DGG), gallium lithium fluoride (GLF), dysprosium aluminum garnet (DAG), etc. The choice of material depends upon the temperature at which the magnet is operated. In particular temperature ranges, magnetocaloric materials also have an uncharacteristically high specific heat. These maximums of specific heat can likewise be used to prolong the time to quench. FIG. 3B shows the specific heat of the magnetocaloric material $(Er_{0.53}Ho_{0.47})Co_2$ (from: Zhu Y, Asamoto K, Nishimura Y, Kouen T, Abe S, Matsumoto K, et al. Cryogenics 2011; 51:494). Embodiments of the present invention can also be used to modify the specific heat of the magnetocaloric material by applying a magnetic field using the auxiliary coil (i.e., the magnet coil of the heat sink apparatus) such that the specific heat is optimized for the operating temperature of the magnet. If, for instance, the magnet is operated at 60K and $(Er_{0.53}Ho_{0.47})Co_2$ is used as the magnetocaloric material, a field of 4 T-5 T could be applied by the auxiliary coil. The specific heat of the magnetocaloric material is then at its maximum at the operating temperature, slowing the increase in system temperature in the event of a cooler malfunction. The high thermal capacity of the magnetocaloric material has another significant advantage, namely that dynamic fluctuations (e.g. by the cooler) are dampened.

The auxiliary coil of the heat sink apparatus may be integrated in the cryostat system in such a way to minimize the exposure of the magnetocaloric material to external magnetic fields (e.g., from the main coil of the superconducting magnet arrangement) in order to maximize the potential entropy change. This can be achieved, for example, by suitable geometric positioning (e.g. as far as possible from the main coil) or by providing a magnetic shield (e.g., soft iron or a superconducting material). Furthermore, field-shaping coils can be used to shape the field of the main coil such that regions of low field strength are created. Moreover, the magnetocaloric material may be placed in a location where the magnetic field is not strong enough to completely saturate the material.

Substantially similar solutions may combine some or all the techniques described above. In other words, the geometry may be chosen appropriately (e.g. far away), magnetic superconducting shields, and field-shaping coils may be used to minimize the external magnetic field to which the magnetocaloric material of the heat sink apparatus is exposed. There may also be regions of very low field strength quite close to the magnet. Owing to the shielding, some of the field zeroes may lie within the main coil of the superconducting magnet arrangement.

The field change within the main coil that occurs when the auxiliary coil of the heat sink apparatus is operated within the center of the main coil should be kept small by proper placement and/or shielding. The aforementioned solutions (i.e., placement and passive shielding) are helpful in minimizing the magnetic field from operating the heat sink apparatus on the main coil, as well. However, it is also possible to actively shield the magnetocaloric unit itself. If the auxiliary coil is configured as a solenoid, a second solenoid, which carries current in the opposite direction and is electrically connected in series to the auxiliary coil, can be placed externally around the field-shaping unit. In this way, the active shielding of the second solenoid reduces the stray field of the heat sink apparatus. Alternatively, the magnetocaloric unit could be configured as a toroidal core coil. Toroidal core coils have a smaller stray field as a result of their design.

During normal operation, the temperature of the magnetocaloric material is kept constant using a temperature control device so that there are no changes in the magnetization, which could affect the magnetic field in the center of the main coil. In one example, this can be implemented by measuring the temperature of the magnetocaloric material (for example, using a resistance thermometer). A Proportional Integral Derivative (PID) controller operates a heater that is applied to the magnetocaloric material to maintain a constant temperature. In another example, a constant temperature may be achieved by thermally insulating the magnetocaloric material (e.g. by means of a radiation shield) well enough that the material is not subject to any external interference, such as a variable heat load. In thermally insulating the magnetocaloric material from external interference, care should be taken to ensure that the magnetocaloric material maintains good contact with the main coil or with the support elements that the heat sink apparatus is intended to cool in the event of a cryocooler malfunction.

The auxiliary coil can also be combined with the main coil, either such that the auxiliary coil and the main coil are connected to one another in series or such that there is only one coil and the magnetocaloric material is arranged in the field of the main coil.

Figure 2A:
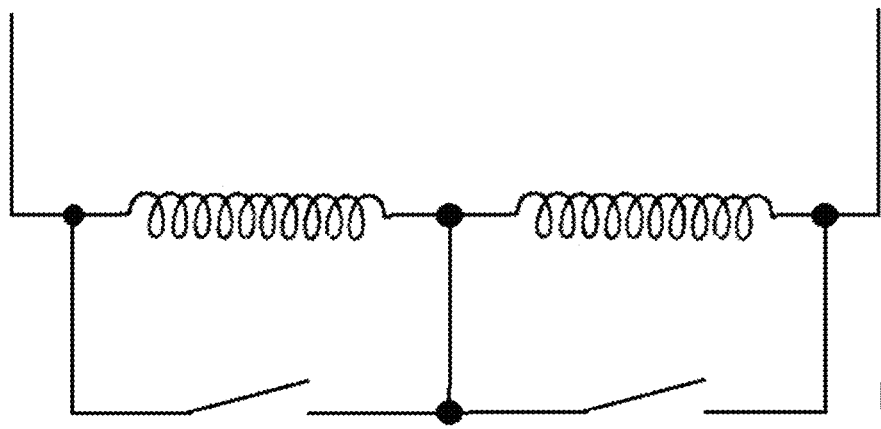
FIG. 2A is an electric wiring diagram of an example embodiment of a magnetocaloric auxiliary coil which is parallel to the main field coil of the superconducting magnet arrangement.
Figure 2B:
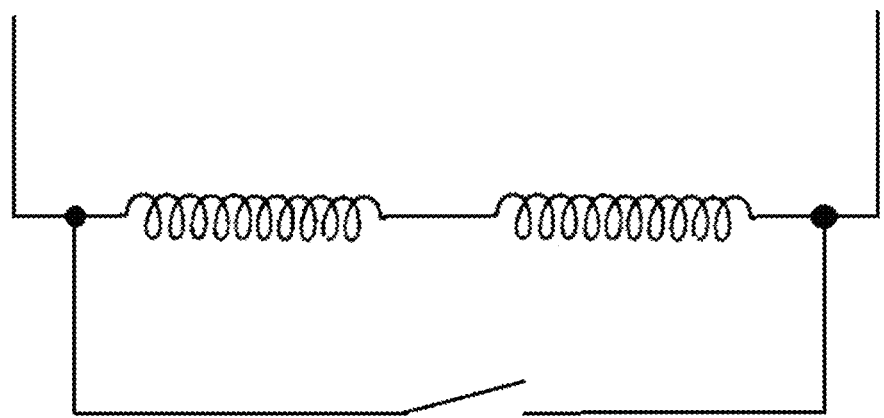
FIG. 2B is a wiring diagram as in FIG. 2A, but for an example embodiment in which the coils are electrically connected in series.

If the auxiliary coil and the main magnet coil are supplied with current separately from one another, the electrical configuration of the two coils would be approximately as is shown in FIG. 2A. Alternatively, the main coil and the auxiliary coil may be connected in series and the two switches could be omitted, as is shown in FIG. 2B. In this case, the field in the main coil and in the auxiliary coil could then no longer be selected separately, i.e. if active cooling were to malfunction, the main coil would also discharge at the same time as the auxiliary coil. The circuitry described in FIG. 2B also applies when there are no separate auxiliary coil for the magnetocaloric unit, i.e., when the magnetocaloric material is positioned in the field of the main coil.

It should be noted in particular here that the power dissipation in the superconducting switches remains minor when they are opened. A typical value for power dissipation in a superconducting switch in cryogen-free magnet systems is 10 mW.

In some examples, the heat sink apparatus is thermally connected to parts of the cryostat system through which ambient heat flows to the superconducting magnet arrangement. These parts include parts of the cryocooler, radiation shields, mechanical suspension devices for the magnet arrangement, and/or electric supply lines to the magnet arrangement that are arranged within the cryostat system.

The heat sink apparatus is usually brought directly into thermal contact with the main coil of the superconducting magnet arrangement. However, since the main coil itself does not generate heat, it may be sufficient to couple all of the "heat paths" leading to the main coil to the heat sink. In this way, the heat sink absorbs the heat flowing along said paths to the main coil. A further advantage is that the heat sink can be operated at higher temperatures. For example, when the heat sink is optimized for 4K but the magnet is operated at 3K. In this case, the heat sink can be coupled to the main coil with a relatively low thermal conductivity connection, and the heat sink absorbs the incoming heat directly from the mechanical support structures, etc.

In one example, the heat sink apparatus in the cryostat system is arranged relative to the superconducting magnet arrangement to minimize magnetic fields from the superconducting magnet arrangement at the magnetocaloric material. For instance, the magnetic field at the magnetocaloric material may be <2 Tesla at the end of the demagnetization process, i.e., after absorbing external heat when the active cooling of the cryocooler fails.

The heat sink absorbs heat during the demagnetization process. The field in which the demagnetization process ends is the background field, which is generated by the main coil of the superconducting magnet arrangement, at the point where the heat sink is located. The more the heat sink can be demagnetized, the greater the entropy change in the magnetocaloric material can be, i.e. the more heat can be absorbed. If the magnetocaloric material is completely field-free, the heat absorption capacity for a given starting field is at its most efficient.

In another example, a temperature control unit for the magnetocaloric material is present during normal operation. The temperature control unit comprises a thermometer, a heating apparatus, and an electronic heat control unit for the heat sink apparatus. The magnetization of the magnetocaloric material is temperature-dependent. If there is a change in the temperature of the material, and thus in its magnetization, the magnetic field in the sample volume changes and the magnetic resonance measurement of the sample may be affected. If there were no form of temperature stabilization, then the temperature of the magnetocaloric material would change, e.g. during slight fluctuations in the cooling performance of the cryocooler.

In a further example, the cryostat system includes a heat sink apparatus comprising at least one, optionally more than one, magnet coil. For the magnetocaloric material to be demagnetized, the magnetic field is modified at the location of the heat sink. This is easiest to do when the heat sink is equipped with its own coil. If the heat sink uses its own coil, the field of the auxiliary coil in the heat sink can be modified independently of the field of the main coil of the superconducting magnet arrangement. This is advantageous because, in the event of a cryocooler malfunction, the auxiliary coil of the heat sink can be discharged without affecting the main coil of the superconducting magnet arrangement.

In one example, the auxiliary coil of the heat sink apparatus is superconductively short-circuited during operation to generate a persistent magnetic field. In that case, current does not have to be supplied to the auxiliary coil from an external power supply, which reduces the heat load on the entire cryostat system (e.g., no Ohmic heating in the supply lines to the auxiliary coil).

In another example, the auxiliary coil of the heat sink apparatus is electrically connected to a main coil of the superconducting magnet arrangement. The same power supply can thus be used for the main coil and the auxiliary coil in the heat sink, which reduces the complexity of the system and also reduces the heat load during operation. As can be seen in FIG. 2A, two superconducting switches may be used to separate control the fields of the main coil and the auxiliary coil.

In a further example, the auxiliary coil of the heat sink apparatus is electrically connected in series to the main coil of the superconducting magnet arrangement. The greatest advantage here is a reduction in the complexity of the cryostat system. As can be seen in FIG. 2B, it is possible to forgo one switch in this way. A drawback of this example is that the mode of operation is limited, since the heat sink can no longer be controlled independently of the main coil of the superconducting magnet arrangement.

In a particularly compact example, the auxiliary coil of the heat sink apparatus and the main coil of the superconducting magnet arrangement are spatially arranged and electrically interconnected in such a way that together they form a magnetic field-generating coil. This is the simplest arrangement, and it reduces the complexity as much as possible. If the cooler malfunctions, the main field magnet is discharged, and the magnetocaloric material is thereby demagnetized.

In one example of the cryostat system, the heat sink apparatus, in particular an auxiliary coil in the heat sink apparatus, is surrounded by a magnetic shield. This provides several advantages at once. First, the minimum field to which it is possible to demagnetize the magnetocaloric material is smaller than it is without shielding, which results in increased efficiency. In addition, disturbances in sample volumes caused by the heat sink (e.g. because the temperature of the magnetocaloric material changes or because the current in the auxiliary coil of the heat sink is changed) are attenuated at the location of the sample volume within the superconducting magnet arrangement.

The magnetic shielding of the heat sink apparatus may include an active shield magnet coil. Active shielding provides the same advantages discussed above, primarily the fact that changes in the current of the auxiliary coil in the heat sink bring about only a minor change to the magnetic field outside of the heat sink. Moreover, active shield coils are particularly compact and efficient.

Alternatively, the magnetic shielding of the heat sink apparatus can have a passive magnetic shield arrangement, in particular a passive magnetic shield comprising superconducting material, soft iron, or a short-circuited coil made of superconducting wire. Passive magnetic shielding is particularly inexpensive, technically simple to implement, and very well-suited to suppress field disturbances caused by temperature changes in the magnetocaloric material.

In one example of the cryostat system, the superconducting magnet arrangement comprises high temperature superconductor (HTS) elements. One advantage of using HTS material is the fact that either especially high fields can be achieved or the magnet can be operated at comparably high temperatures, which simplifies the cooling system.

Embodiments of the cryostat system may be used as part of a piece of magnetic resonance equipment, such as NMR or MRI equipment.

Additionally, the cryostat system may include a heat sink apparatus comprising one or more of the magnetocaloric materials GGG (gadolinium gallium garnet), DGG (dysprosium gallium garnet), GLF (gallium lithium fluoride), or DAG (dysprosium aluminum garnet).

Figure 1:
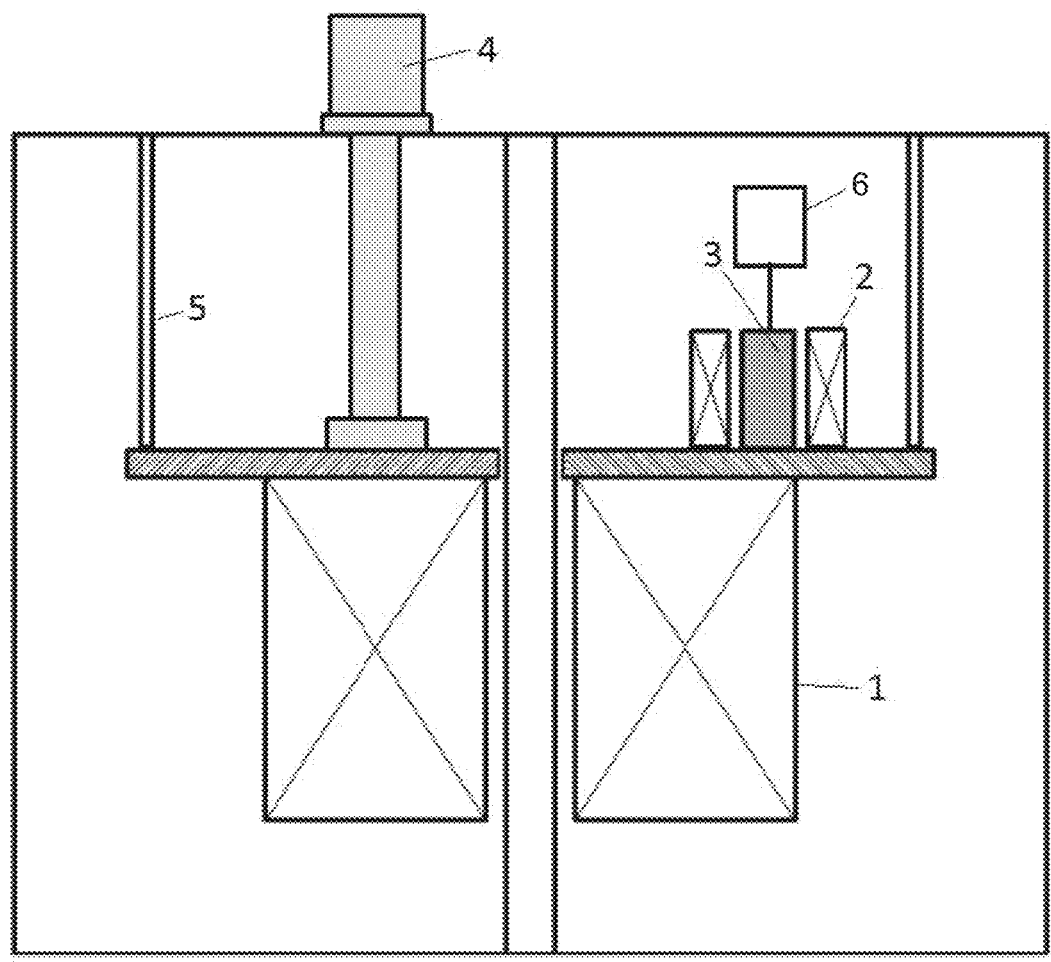
FIG. 1 is a schematic vertical sectional view of an embodiment of the cryostat system according to an example embodiment.

FIG. 1 illustrates a simplified schematic of the cryostat system according to one embodiment. This cryostat system can be kept at a cryogenic operating temperature in a dry manner, i.e. without providing or supplying cryogenic fluids, by means of a cryocooler 4. At least during operation, the cryostat system includes a superconducting magnet arrangement 1 and a heat sink apparatus for prolonging the time before the superconducting magnet arrangement 1 returns to the normally conducting state (i.e., "time to quench") if active cooling from the cryocooler 4 fails.

The cryostat system includes a heat sink apparatus comprising magnetocaloric material 3. The heat sink apparatus is thermally connected to the superconducting magnet arrangement 1 and/or to parts of the cryostat system, through which ambient heat can flow to the superconducting magnet arrangement 1, and/or to a temperature control device 6.

In the embodiment shown, the heat sink apparatus includes an auxiliary magnet coil 2. The magnet coil 2 of the heat sink apparatus may be superconductively short-circuited during operation and may be electrically connected to a main coil of the superconductively short-circuited magnet arrangement 1, as is shown in FIGS. 2A and 2B, to generate persistent magnetic fields. FIG. 2B shows one example of the cryostat system in which the magnet coil 2 of the heat sink apparatus is electrically connected in series to a main coil of the superconducting magnet arrangement 1, and the two coils are arranged spatially such that together they form a magnetic field-generating coil.

Some parts of the cryostat system allow ambient heat to flow to the magnet arrangement 1. The parts of the cryostat system may include parts of the cryocooler 4, radiation shields, mechanical suspension devices 5 for the magnet arrangement 1, and/or electric supply lines to the magnet arrangement 1 that are arranged within the cryostat system.

The heat sink apparatus in the cryostat system may be arranged relative to the superconducting magnet arrangement 1 to minimize magnetic fields from the superconducting magnet arrangement at the magnetocaloric material 3. In particular, the background field at the magnetocaloric material may be <2 Tesla at the end of the demagnetization process to absorb external heat input when the active cooling of the cryocooler 4 fails.

The main field of application of the cryostat system has been described herein as use in magnetic resonance equipment. However, the cryostat system described herein may be used in any field that requires low temperature measurements, particularly for stable measurements in cryogen-free cryostats.

LIST OF REFERENCE NUMBERS

1 Superconducting magnet arrangement
2 Auxiliary magnet coil
3 Magnetocaloric material
4 Cryocooler
5 Mechanical suspension devices
6 Temperature control device

What is claimed is:

1. A cryostat system configured to be kept at a cryogenic operating temperature in a dry manner without providing or supplying cryogenic fluids, the cryostat system comprising:
    a cryocooler configured to provide active cooling without cryogenic fluid;
    a superconducting magnet arrangement; and
    a heat sink apparatus comprising a magnetocaloric material, and configured to prolong a time to quench before the superconducting magnet arrangement returns to a normally conducting state if the active cooling fails, wherein the heat sink apparatus is thermally connected to the superconducting magnet arrangement or to parts of the cryostat system, through which ambient heat flows to the superconducting magnet arrangement.

2. The cryostat system according to claim 1, wherein the parts of the cryostat system, through which ambient heat flows to the superconducting magnet arrangement, comprise parts of the cryocooler, radiation shields, or mechanical suspension devices for the superconducting magnet arrangement.

3. The cryostat system according to claim 1, wherein the heat sink apparatus is arranged relative to the superconducting magnet arrangement to minimize magnetic fields from the superconducting magnet arrangement at the magnetocaloric material.

4. The cryostat system according to claim 3, wherein the magnetic fields from the superconducting magnet arrangement at the magnetocaloric material are less than 2 Tesla after a demagnetization process.

5. The cryostat system according claim 1, further comprising a temperature control device configured to keep the temperature of the magnetocaloric material constant during normal operation.

6. The cryostat system according to claim 1, wherein the heat sink apparatus includes at least one magnetic coil.

7. The cryostat system according to claim 6, wherein the magnet coil of the heat sink apparatus is superconductively short-circuited when in operation.

8. The cryostat system according to claim 6, wherein the magnet coil of the heat sink apparatus is electrically connected to the superconducting magnet arrangement.

9. The cryostat system according to claim 8, wherein the magnet coil of the heat sink apparatus is electrically connected in series to the superconducting magnet arrangement.

10. The cryostat system according to claim 9, wherein the magnet coil of the heat sink apparatus and the superconducting magnet arrangement are spatially arranged and electrically interconnected to form a magnetic field-generating coil.

11. The cryostat system according to claim 1, further comprising a magnetic shield that surrounds the heat sink apparatus.

12. The cryostat system according to claim 11, wherein the magnetic shield surrounds a magnet coil of the heat sink apparatus.

13. The cryostat system according to claim 11, wherein the magnetic shield includes an active shield magnet coil.

14. The cryostat system according to claim 11, wherein the magnetic shield is a passive magnet shield arrangement.

15. The cryostat system according to claim 14, wherein the passive magnet shield arrangement comprises a superconducting material, soft iron, or a short-circuited coil made of superconducting wire.

16. The cryostat system according to claim 1, wherein the superconducting magnet arrangement comprises high temperature superconducting (HTS) elements.

17. The cryostat system according to claim 1, wherein the cryostat system is part of a magnetic resonance equipment.

18. The cryostat system according to claim 1, wherein the magnetocaloric material of the heat sink apparatus comprises gadolinium gallium garnet (GGG), dysprosium gallium garnet (DGG), gallium lithium fluoride (GLF), or dysprosium aluminum garnet (DAG).

* * * * *